(12) United States Patent
Kakoschke et al.

(10) Patent No.: US 7,989,294 B2
(45) Date of Patent: Aug. 2, 2011

(54) VERTICAL FIELD-EFFECT TRANSISTOR

(75) Inventors: Ronald Kakoschke, München (DE); Helmut Tews, München (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/704,287

(22) Filed: Feb. 11, 2010

(65) Prior Publication Data
US 2010/0142266 A1 Jun. 10, 2010

Related U.S. Application Data

(62) Division of application No. 10/521,528, filed as application No. PCT/DE03/01957 on Jun. 12, 2003, now Pat. No. 7,786,530.

(30) Foreign Application Priority Data

Jul. 15, 2002 (DE) .................................. 102 31 966

(51) Int. Cl.
*H01L 21/336* (2006.01)
(52) U.S. Cl. .................. 438/270; 438/268; 438/286
(58) Field of Classification Search .................. 438/589, 438/268, 270, 296, 197, 286; 257/E21.41; 365/185.01, 182
See application file for complete search history.

(56) References Cited

U.S. PATENT DOCUMENTS

| | | | | |
|---|---|---|---|---|
| 5,940,707 A | * | 8/1999 | Gardner et al. | 438/270 |
| 5,963,061 A | * | 10/1999 | Briner | 327/55 |
| 6,239,465 B1 | * | 5/2001 | Nakagawa | 257/331 |

FOREIGN PATENT DOCUMENTS

JP 53067381 6/1978

OTHER PUBLICATIONS

EPO Office Action for Application No. 03 787 593.7 dated Oct. 28, 2010, (9p).

* cited by examiner

*Primary Examiner* — Wael M Fahmy
*Assistant Examiner* — Sarah K Salerno

(57) ABSTRACT

A method produces a vertical field-effect transistor having a semiconductor layer, in which a doped channel region is arranged along a depression. A "buried" terminal region leads as far as a surface of the semiconductor layer. The field-effect transistor also has a doped terminal region near an opening of the depression as well as the doped terminal region remote from the opening, a control region arranged in the depression, and an electrical insulating region between the control region and the channel region. The terminal region remote from the opening leads as far as a surface containing the opening or is electrically conductively connected to an electrically conductive connection leading to the surface. The control region is arranged in only one depression. The field-effect transistor is a drive transistor at a word line or at a bit line of a memory cell array.

17 Claims, 8 Drawing Sheets

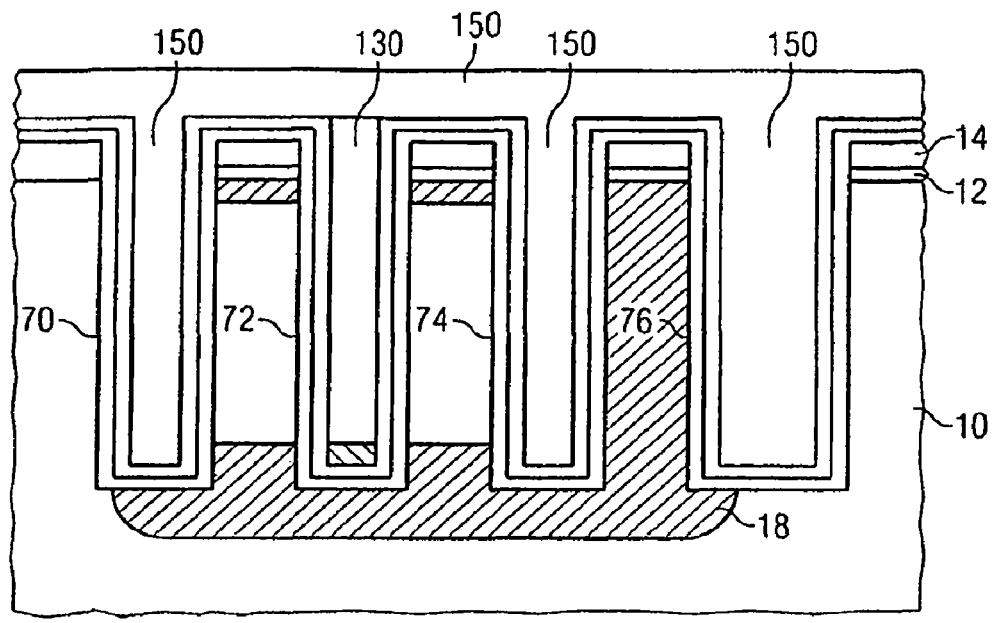
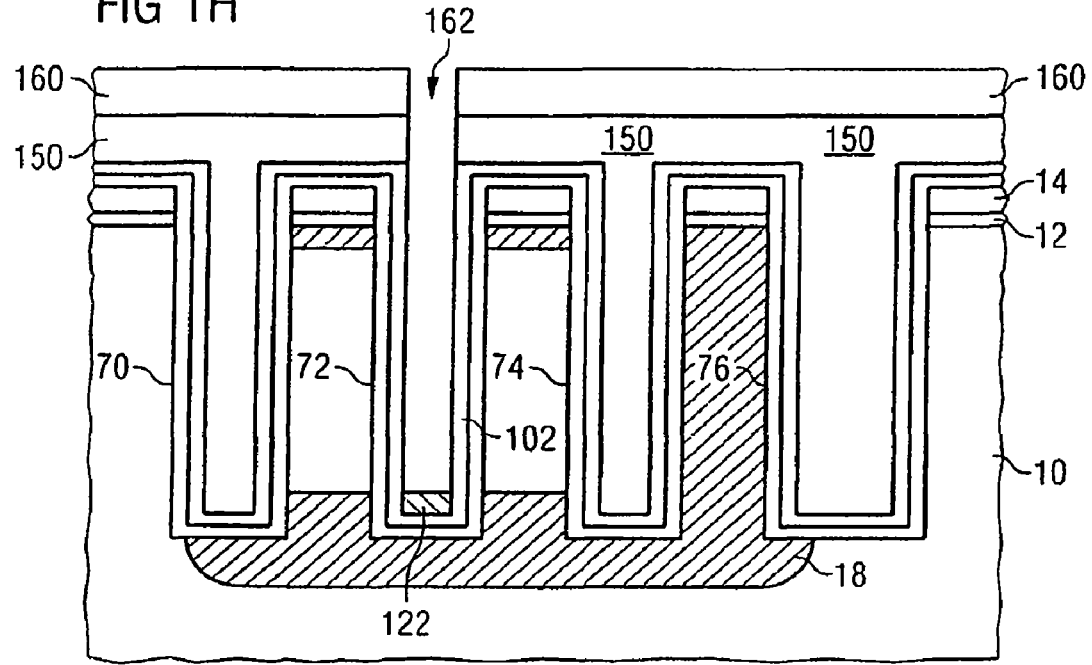

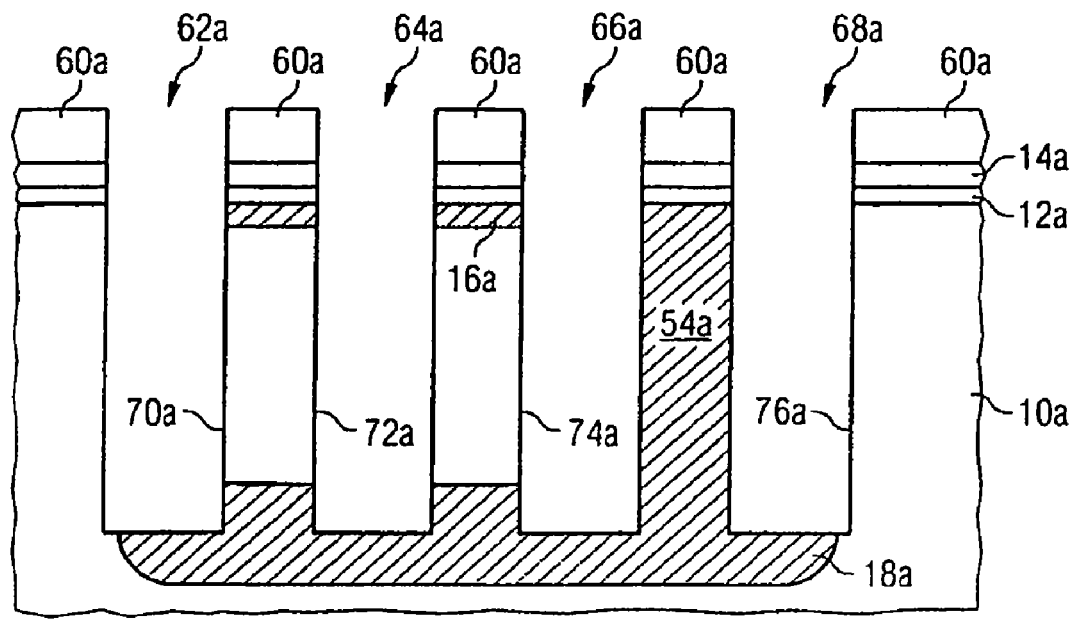
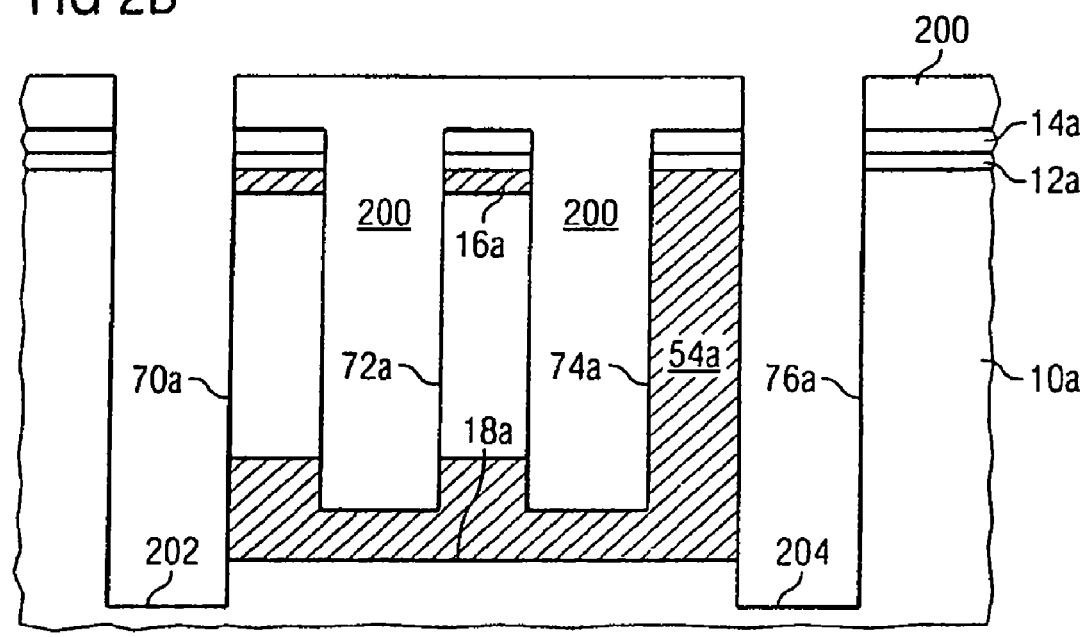

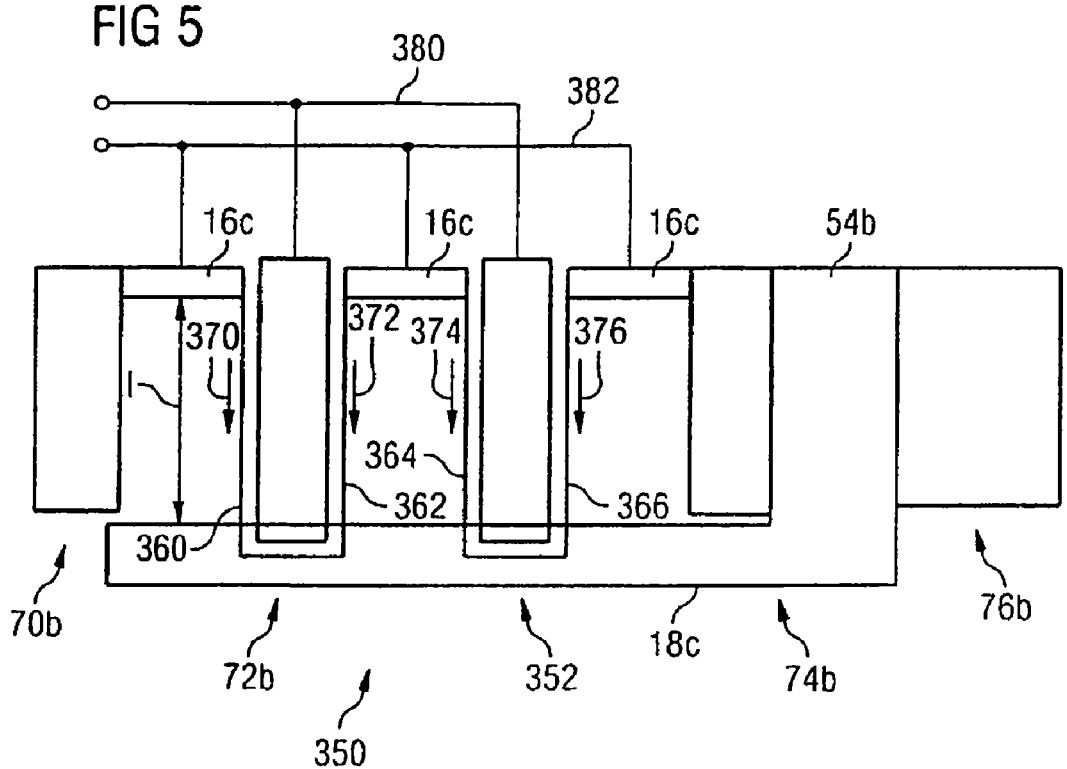
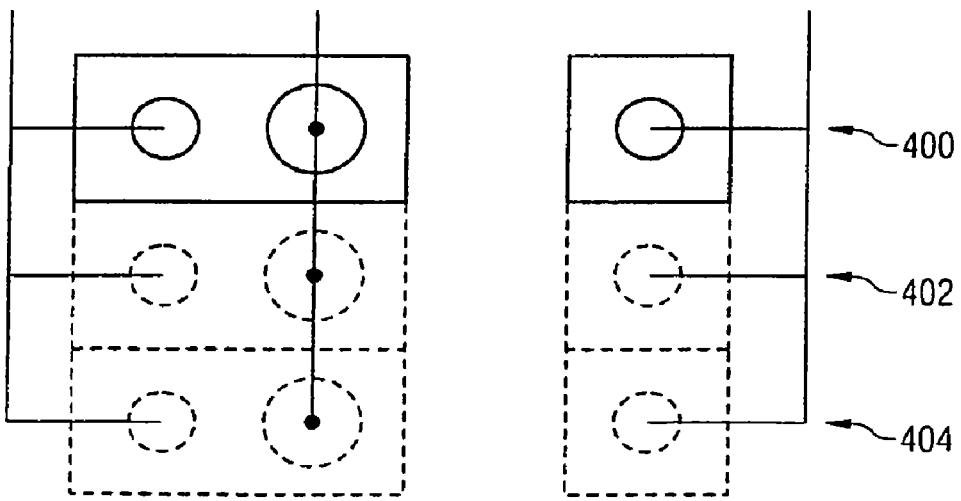

VERTICAL FIELD-EFFECT TRANSISTOR

PRIORITY CLAIM

This application is a divisional of U.S. application Ser. No. 10/521,528, filed Nov. 3, 2005, which is the national stage application of international application number PCT/DE2003/001957, filed Jun. 12, 2003, which claims the benefit claims the benefit of priority from German Patent Application No. DE 10231966.9, filed Jul. 15, 2002, each of which is incorporated herein by reference in its entirety.

BACKGROUND

The invention relates to a field-effect transistor containing, in a semiconductor layer, a doped channel region, two terminal regions, which are also referred to as drain and source, respectively, a control region, which is also referred to as gate, and an electrical insulating region between the control region and the channel region.

The semiconductor layer comprises a material having an electrical resistivity of between $10^{-4}$ Ω/cm to $10^{8}$ Ω/cm (ohms per centimeter), for example silicon or gallium arsenide. The semiconductor layer is, by way of example, a semiconductor substrate with an n-type doping or p-type doping. However, there are also technologies in which the semiconductor layer has been applied on an insulating substrate, e.g. in accordance with SOI technology (Silicon On Insulator).

Field-effect transistors are differentiated into n-channel transistors and p-channel transistors depending on the type of channel which forms in the channel region.

A multiplicity of field-effect transistors are arranged in an integrated circuit arrangement, so that even small improvements or alterations to the construction of a field-effect transistor can lead to considerable improvement and increases in yield.

It is an object of the invention to specify a field-effect transistor of simple construction which, in particular, can be fabricated in a simple manner and which, in particular, can be fabricated with a small area requirement relative to the surface of the semiconductor wafer to be processed. Moreover, the intention is to specify an associated use and an associated fabrication method.

The field-effect transistor according to the invention contains a depression in the semiconductor layer, the control region and the electrical insulating region being arranged in said depression. The channel region runs along the depression in the semiconductor layer. The depression has an opening in a surface of the semiconductor layer that is to be processed, one terminal region lying in the vicinity of said opening. The other terminal region is further away from the opening than the terminal region near the opening and is therefore referred to as terminal region remote from the opening. The terminal region remote from the opening lies at the end of the depression, for example. In the field-effect transistor according to the invention, the terminal region remote from the opening leads from the interior of the semiconductor layer as far as a surface of the semiconductor layer that contains the opening, or is electrically conductively connected to an electrically conductive connection which leads to the surface.

The field-effect transistor according to the invention is thus a field-effect transistor whose channel region extends in the vertical direction with respect to the surface of the semiconductor layer or at least transversely with respect to said surface. As a result, the area required for the field-effect transistor becomes independent of the channel length required or becomes dependent given an inclined position of the channel region only over a factor of less than 1. In comparison with a planar field-effect transistor, however, the integration of the transistor into an integrated electrical circuit is not more complex because the terminal region remote from the opening, which region lies in the interior of the semiconductor layer, leads to the surface to be processed or is electrically conductively connected to said surface via an electrically conductive connection.

In one development of the field-effect transistor according to the invention, the two terminal regions have the same dopant concentration and dopants of the same conduction type, i.e. either n-conducting or p-conducting. In one refinement, the channel region has a doping of the opposite conduction type to the terminal regions and adjoins both terminal regions. Additional doping regions between the terminal regions are not present in this refinement.

In a next refinement, the channel region has a length corresponding to at least two thirds of the depth of the depression. In this development, the depression is introduced only to the depth necessary for obtaining the required channel length.

In another development, the depression is a trench. The length of the trench determines the transistor width, i.e. a critical parameter of the field-effect transistor. In an alternative development, the depression is a hole having a depth which exceeds the diameter or the width of the hole by at least two-fold, by way of example. The diameter of the hole determines the transistor width. The depth determines the gate length. In the case of cylindrical holes, in particular, layers can be deposited very uniformly on the hole wall.

In a next development of according to the invention, the field-effect transistor the channel region lies on both sides of the trench or along the entire periphery of the hole. By virtue of these measures, transistors having a comparatively large transistor width can also be fabricated in a simple manner.

In an alternative development, on the other hand, the channel region lies only on one side of the trench or only along part of the periphery of the hole. Transistors which require only a comparatively small width can thus be fabricated in a simple manner. Those regions at the trench or at the periphery of the hole which are not occupied by the channel region are utilized for the arrangement of other components or as part of insulating regions.

In a next development of the method according to the invention, the terminal region remote from the opening extends in the region of a plurality of depressions in which control regions are arranged. By way of example, the field-effect transistor contains two, three or more depressions lined up in the manner of a cascade. The cascading leads to a further reduction of the area requirement. Moreover, the terminal region remote from the opening only has to be led to the surface once per field-effect transistor, independently of the number of cascadings.

In a next development, the depression for the control region and a depression filled with an electrical insulating material between the field-effect transistor and an adjacent electrical component have the same depth. The two depressions can thus be fabricated in a simple manner in a common lithography process.

In an alternative development, by contrast, the depression for the control region has a smaller depth than a depression completely filled with an electrical insulating material between the field-effect transistor and an adjacent electronic component. This measure allows the depression for the insulating material to be made narrower without impairing the insulating capability in comparison with a wider insulation which, however, is not as deep.

In a next development, the individual elements of the field-effect transistor have dimensions and/or a structure which permit the switching of voltages of greater than 9 volts, greater than 15 volts, but less than 30 volts:

the insulating region has, by way of example, an insulating thickness of at least 15 run (nanometers) or of at least 20 nm, the distance between the terminal regions along the depression is at least 0.4 µm (micrometer), the terminal regions have a shallow doping profile gradient of about 200 run/decade in comparison with the doping profiles of planar field-effect transistors. In particular, the shallow doping profile gradient can be produced in a simple manner on account of different penetration depths of the dopants.

The measures mentioned make it possible to produce field-effect transistors which only need less than half the area requirement in comparison with planar field-effect transistors with the same electrical properties. The area saving is particularly large in the aforementioned range of switching voltages and significantly outweighs the fabrication outlay for fabricating the depression.

The invention additionally relates to a use of the field-effect transistor, in particular the field-effect transistor for the aforementioned switching voltages, as driving transistor at a word line or a bit line of a memory cell array. The aforementioned switching voltages are required, in particular, for erasing but also for programming nonvolatile memory cells, such as e.g. of so-called flash memories, in which only a plurality of cells can be erased simultaneously, or of EEPROMs (Electrically Erasable Programmable Read-Only Memories).

In particular, the field-effect transistors according to the invention are used with a degree of integration of the memory cell array in the case of which the memory cell array would take up less than 30% of the chip area of a memory unit with the use of planar field-effect transistors for the driving.

The invention additionally relates simple fabrication method for field-effect transistor according to which:

a semiconductor layer having a surface to be processed is provided, a terminal region near the surface and a terminal region remote from the surface are introduced into the semiconductor layer by doping, at least one depression is etched for a control region from the terminal region near the surface as far as the terminal region remote from the surface, an electrical insulating layer is deposited in the depression, and an electrically conductive control introduced into the depression.

In one development of the method according to the invention, the doping of the terminal regions is performed before the etching and the filling of the depressions, thus resulting in simple processing.

In a next development, a connecting region leading from the terminal region remote from the surface to the surface is doped. An electrically conductive connection is produced in the semiconductor layer a n a simple manner by means of the doping.

In another development, insulating depressions, so-called insulating trenches, are etched at the same time as the depression for the control region. In one refinement, the insulating depressions have the same depth as the depression for the control region. In an alternative, the insulating depressions are deeper than the depression for the control region.

In order to fabricate the insulating depression, in one development, a lithography method is performed in addition to the lithography method for fabricating the depression for the control region. In the additional lithography method, the insulating depressions are etched either to their entire depth or to the depth in which they exceed the depth of the depression for the control region.

In another development with depressions of different depths, however, the depressions are etched by means of a common etching process in which wider depressions are etched considerably more deeply than narrower depressions.

BRIEF DESCRIPTION OF THE DRAWINGS

Other developments can be gathered from the following description of exemplary embodiments. Exemplary embodiments of the invention are explained below with reference to the accompanying drawings, in which:

FIGS. 1A to 1J show intermediate stages in the fabrication of a vertical field-effect transistor in accordance with a first exemplary embodiment, FIGS. 2A and 2B show intermediate stages in the fabrication of a vertical field-effect transistor in accordance with a second exemplary embodiment, FIG. 5 shows a section through a vertical field-effect transistor with doubly cascaded gate regions, and FIG. 6 shows a plan view of parallel-connected vertical field-effect transistors with cylindrical gate regions.

DETAILED DESCRIPTION

Figure 1A:
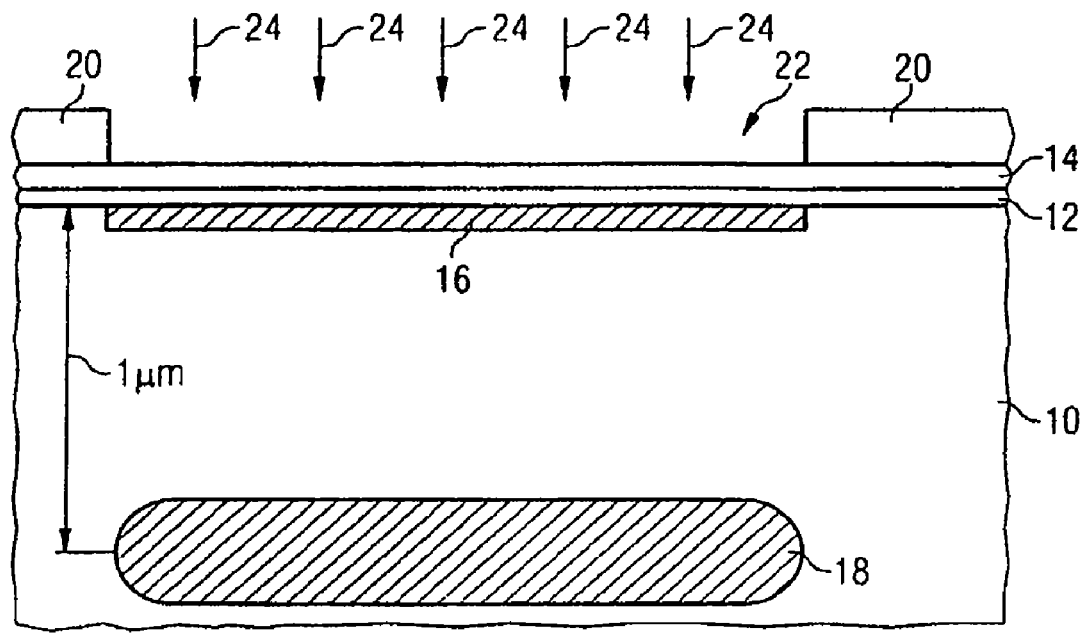

The text below explains a process sequence which can be used to fabricate vertical transistors for switching voltages of between 9 volts and 20 volts with an arbitrary cascading of gate regions. Many process steps of the process sequence can be combined with process steps for fabricating other components of the same integrated circuit arrangement and be carried out jointly, e.g. with process steps for fabricating shallow trench isolations (STI) or gate stacks of planar field-effect transistors. Two process variants are explained, the first process variant of which relates to vertical field-effect transistors having trenches of the same depth and is explained with reference to FIGS. 1A to 1J:

FIG. 1A shows a p-doped semiconductor substrate 10. In a first method step, an oxide layer 12 made of silicon dioxide is produced, which has a thickness of 5 run, for example, and has been produced at 800° C. by means of a dry oxidation for an oxidation duration of about ten minutes. A nitride layer 14, for example made of silicon nitride, is subsequently deposited. The nitride layer 14 has a thickness of 100 nm, for example, and was produced for example with the aid of an LPCVD method (Low Pressure Chemical Vapor Deposition). Afterward, shallow isolation trenches are optionally produced in other regions of the silicon substrate 10.

In the context of a lithography method for a drain region 16, a photoresist layer is subsequently applied on the nitride layer 14, exposed and developed, a cutout being produced above the later drain region 16. An ion implantation is subsequently carried out, during which the drain region 16 is heavily n-doped, i.e. acquires an $n^+$-type doping. The residues of the photoresist layer are then removed.

A next lithography method for producing a source region 18 is subsequently carried out. To that end, a photoresist layer 20 is applied to the nitride layer 14. The photoresist layer 20 is exposed and developed to produce a cutout 22, through which, during a subsequent ion implantation, see arrows 24, ions penetrate right into the source region 18 to be doped.

The drain region 16 and the source region 18 can also be fabricated using the same photomask if they are intended to have identical lateral extents.

The distance between the surface of the semiconductor substrate 10 and hence the top side of the drain region 16 and the center of the source region 18 is 1 µm in the exemplary embodiment. By way of example, a concentration of about $10^{20}$ cm$^{-3}$ (doping atoms per cubic centimeter) is chosen as dopant concentration in the drain region 16 and in the source region 18.

Figure 1B:
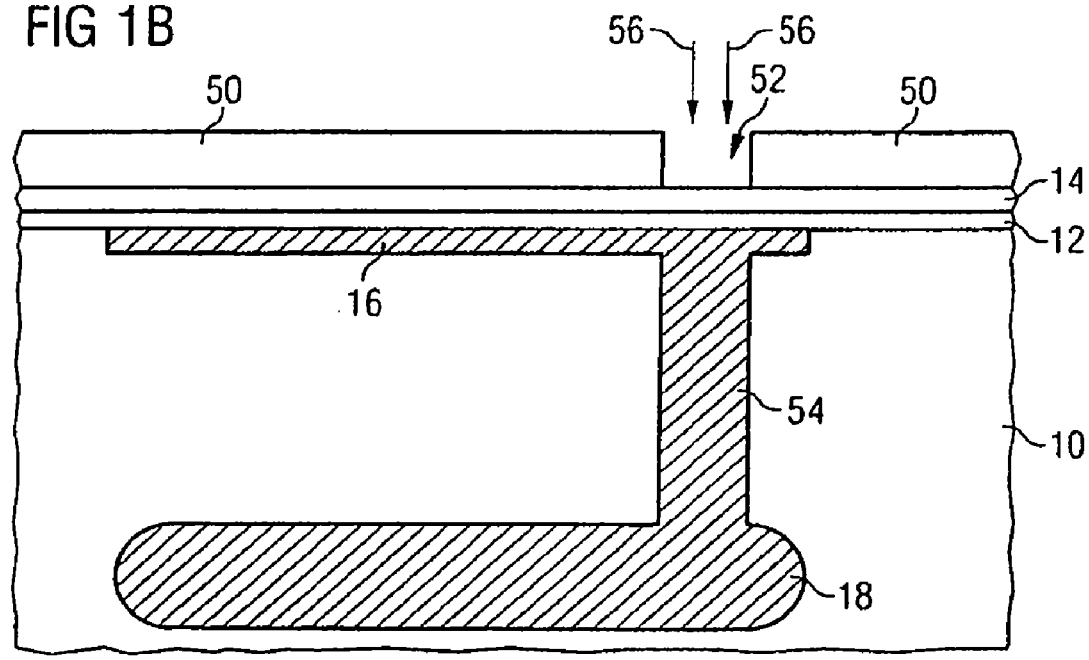

As illustrated in FIG. 1B, after the removal of the residues of the photoresist layer 20, a photoresist layer 50 is applied to the nitride layer 14. The photoresist layer 50 is exposed and developed to produce a cutout 52 above the edge regions of the drain region 16 and source region 18, respectively. Ions penetrate through the cutout 52 in a plurality of successive implantation steps with decreasing implantation depths, which ions n$^+$-dope a vertical connecting region 54. In the exemplary embodiment, the connecting region 54 initially connects the drain region 16 and the source region 18. After the ion implantation represented by the arrows 56, the residues of the photoresist layer 50 are removed.

The implantation steps can also be performed at later points in time if this is more expedient in the context of the overall process implementation, e.g. after the etching of trenches for fabricating the field-effect transistor.

Figure 1C:
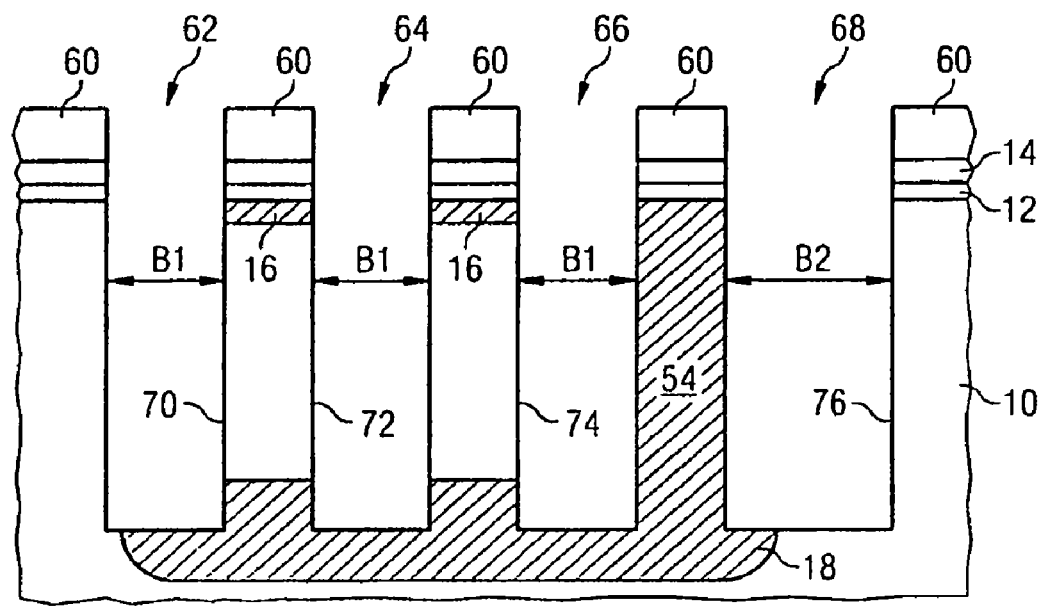

As shown in FIG. 1C, a hard mask layer 60 is subsequently applied on the nitride layer 14. The hard mask layer 60 comprises TEOS (tetraethyl orthosilicate) for example. In a lithography method, a photoresist layer is deposited on the hard mask layer 60, exposed and patterned. Afterward, the hard mask 60 is opened in regions 62, 64, 66 and 68 above trenches to be produced, in an etching process. In a subsequent RIE etching step, the hard mask 60 is then utilized for producing trenches 70, 72, 74 and 76 lined up in this order along the drain region 16 and along the source region 18, respectively. The trenches 70, 72 and 74 have a width B1 of 150 nm, for example, and a depth of 1 µm, for example. The trench 76 has a width B2, which is about twice as large as the width B1 in the exemplary embodiment. The trench 76 also has a depth of about 1 µm in the exemplary embodiment. All the trenches 70 to 76 reach as far as the source region 18 and end approximately in the center of the source region 18. The trench 74 isolates the drain region 16 from the connecting region 54. In another exemplary embodiment, the trenches 70 to 76 are rounded at their bottom to a greater extent than is illustrated in FIG. 1C.

Figure 1D:
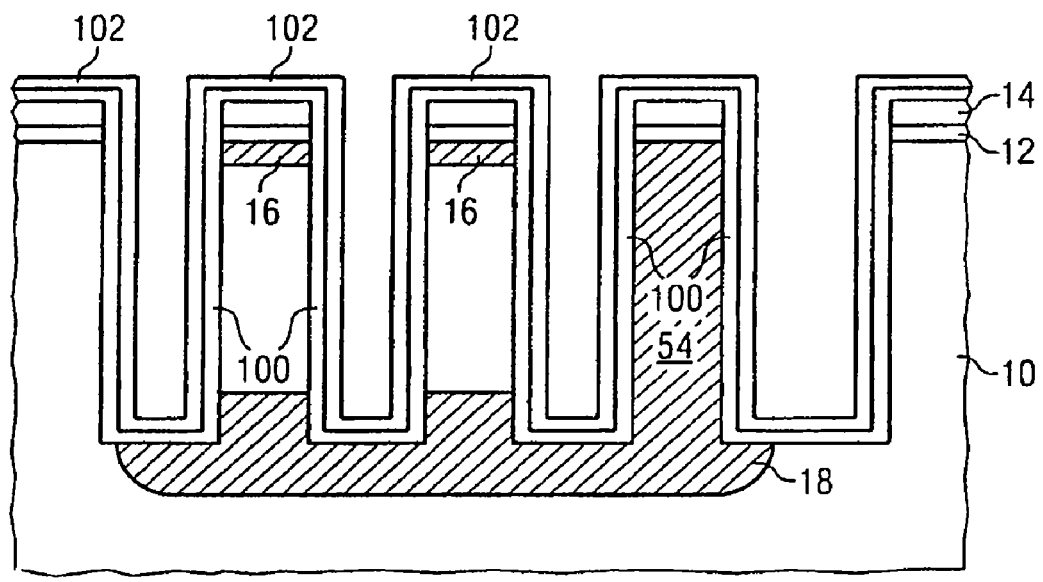

The residues of the hard mask 60 are subsequently removed. Optionally, the residues of the nitride layer 14 can subsequently be removed. In the exemplary embodiment, however, the residues of the nitride layer 14 are not removed. As illustrated in FIG. 1D, an oxidation is then carried out for producing a thin sacrificial oxide layer 100, having a thickness of 10 nm, for example. The oxidation is carried out for example at a temperature of 800° C.

A sacrificial nitride layer 102, which, by way of example, has a thickness of 6 nm and is produced with the aid of an LPCVD method (Low Pressure Chemical Vapor Deposition), is then applied to the sacrificial oxide layer 100.

Figure 1E:
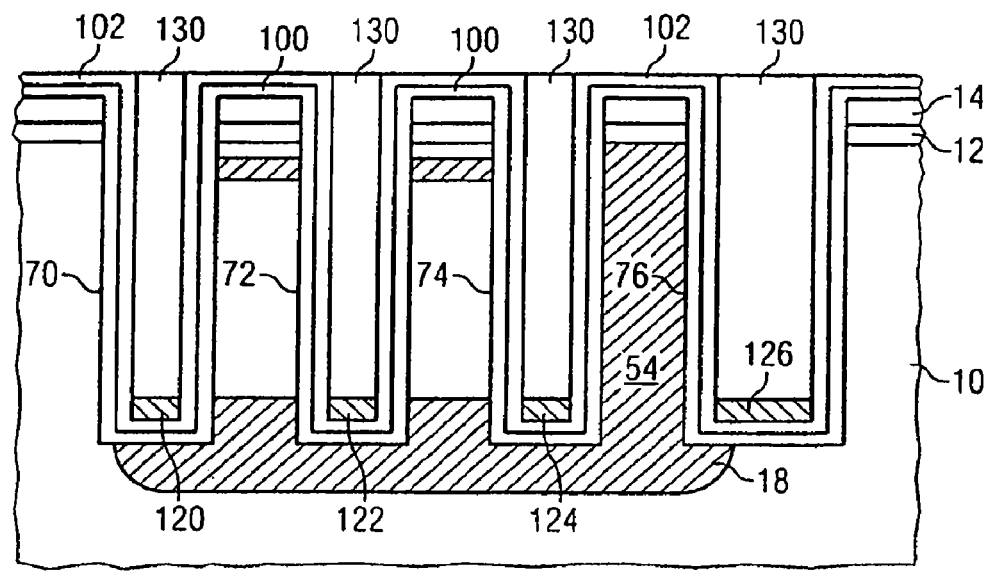

As shown in FIG. 1E, a bottom oxide 120, 122, 124 and 126 is respectively optionally introduced into the trenches 70 to 76, e.g. in an HDP method (High Density Plasma). The oxide deposited with the aid of the HDP method is etched back with the aid of an etching-back process until only the bottom oxide 120, 122, 124 and 126 respectively remains at the bottom of the trenches 70 to 76.

The trenches 70 to 76 are then filled with an undoped sacrificial polysilicon 130. The sacrificial polysilicon 130 is then removed in a planarization step as far as the upper edge of the trenches 70 to 76, e.g. with the aid of a chemical mechanical polishing method.

Figure 1F:
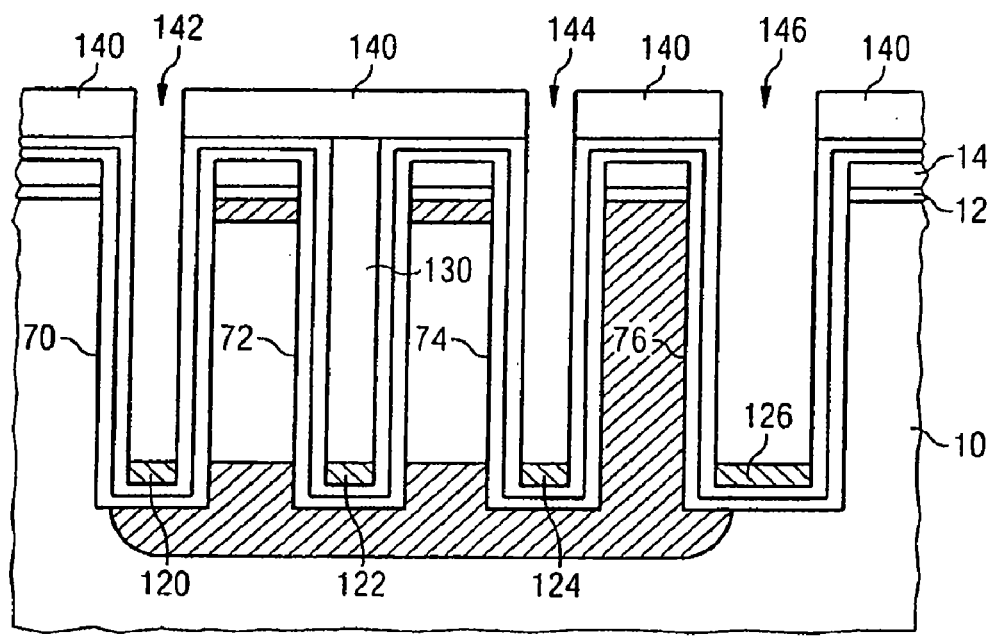

As shown in FIG. 1F, in a subsequent method step, a photoresist layer 140 is applied to the planarized area, exposed and developed to produce cutouts 142, 144 and 146 above the trench 70, 74 and 76, respectively. The photoresist layer 140 is closed, by contrast, above the trench 72. The sacrificial polysilicon 130 arranged in the trenches 70, 74 and 76 is then etched wet-chemically selectively with respect to the sacrificial nitride layer 102. The bottom oxide 120, 124 and 126 remains in the trenches 70, 74 and 76, respectively. Residues of the photoresist layer 140 are then removed.

The sacrificial nitride layer 102 can optionally be removed from the walls of the trenches 70, 74 and 76 in a subsequent etching step. However, this is not absolutely necessary because the sacrificial nitride layer 102 can also remain in the trenches 70, 74 and 76, respectively.

As illustrated in FIG. 1G, insulation material 150, e.g. TEOS, is subsequently deposited in the trenches, 70, 74 and 76. The insulation material 150 also extends over the edge of the trenches 70, 74 and 76, so that it fills the trenches 70, 74 and 76 and at the same time acts as an insulation layer in other parts of the transistor.

As shown in FIG. 1H, a photoresist layer 160 is subsequently applied, exposed and developed to produce a cutout 162 above the trench 72, in which a gate region is intended to be formed. The insulation layer 150 is then removed in the region of the cutout 162. In a subsequent process step, the sacrificial polysilicon 130 is removed from the trench 72, e.g. with the aid of a wet-chemical etching process selectively with respect to the sacrificial nitride layer 102 within the trench 72. The bottom oxide 122 remains in the trench 72. The residues of the photoresist layer 160 are subsequently removed.

Figure 1I:
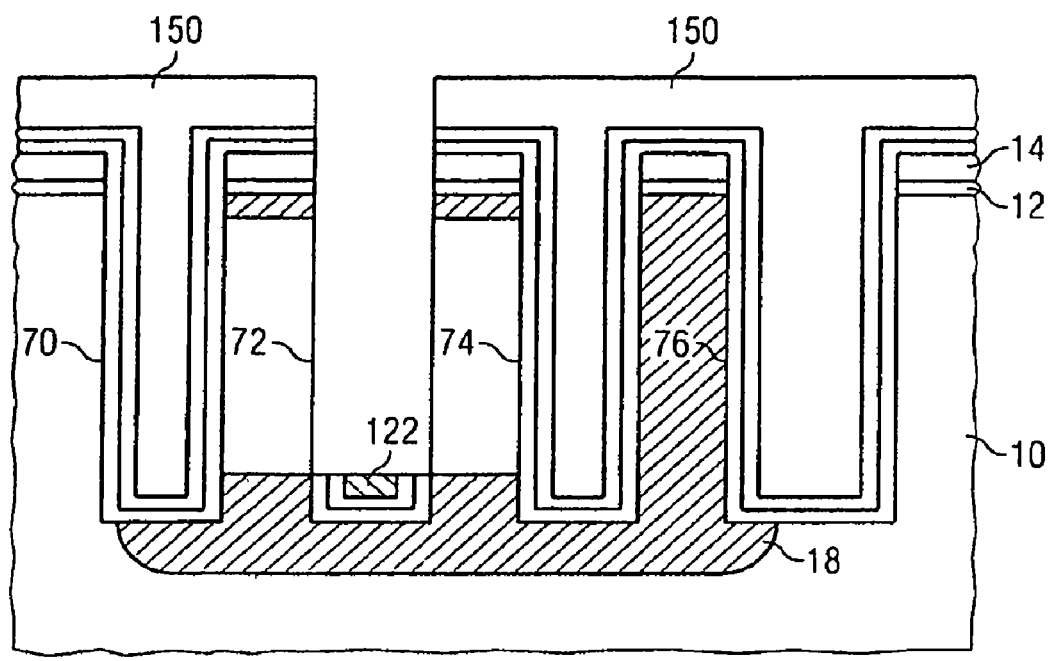

As shown in FIG. 1I, the sacrificial nitride layer 102 and the sacrificial oxide layer 100 are then removed within the trench 72 with the aid of two etching processes. As a result, the trench 72 is free for the deposition of a gate oxide in a subsequent method step. The bottom oxide 122 still remains at the bottom of the trench 72 and promotes the neat deposition of the gate oxide in the region of the corners of the trench 72 and in the region of the lower edges of the trench 72.

Figure 1J:
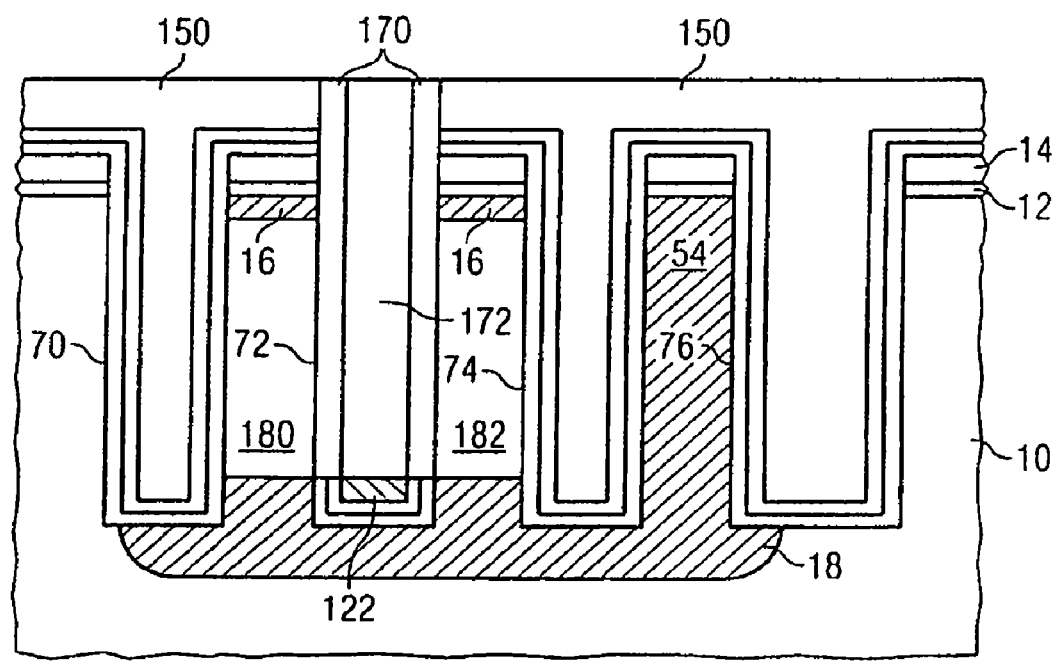

As shown in FIG. 1J, a gate oxide layer 170 is deposited at the sidewalls of the trench 72 with the aid of a thermal oxidation. The gate oxide layer 170 comprises silicon dioxide, for example, and has a thickness of 20 nm, for example. The oxidation for producing the gate oxide layer 170 is carried out in a temperature range of 800° C. to 1000° C., for example.

In a subsequent method step, amorphous silicon 172 is deposited in the trench 72, said silicon being n-doped, for example, and thus electrically conductive. The trench 72 is filled conformally for example with the aid of an LPCVD method, so that no holes or voids are produced within the trench 72. A chemical mechanical polishing method which stops on the insulating material 150 is then carried out.

Optionally, an oxide cap is subsequently produced above the trench 72 for example at a temperature of 900° C. and with an oxidation duration of ten minutes, for example, in a wet oxidation process.

Contact holes leading to the drain region 16, to the connecting region 54 and to the gate region formed by the amorphous silicon 172 are etched in subsequent method steps. The known method steps for fabricating transistors are then performed.

The resulting MOS transistor (Metal Oxide Semiconductor) with a vertical channel as follows:
source region 16,
drain region 18 with electrical terminal 54 of the drain region,
channel region (active area) 180 and 182.

The gate length is equal to the distance between the source region 16 and the drain region 18, that is to say approximately equal to the depth of the trench. The gate width is equal to the length of the trench 72, which is not shown in the cross-sectional drawings.

A p-channel field-effect transistor is fabricated, in principle, in the same way as explained with reference to FIGS. 1A to 1J. In this case, however, an n-doped silicon substrate 10 or a correspondingly doped well is taken as a starting point. The dopings produced with reference to FIGS. 1A to 1J are performed with doping material of the opposite conduction type.

The process sequence with trenches 70 to 76 having the same depth as explained with reference to FIGS. 1A to 1J already leads to a reduced space requirement of vertical transistors having a long gate length in comparison with customary planar transistors having the same gate length. With trenches of different depths for the vertical transistor and the insulation, this space requirement can be reduced further in a second method variant. Essentially the process steps explained with reference to FIGS. 1A to 1J are performed in the case of the second method variant as well. Differences are explained with reference to FIGS. 2A and 2B.

In the second method variant, firstly all the method steps explained above with reference to FIGS. 1A to 1C are performed. However, a trench 76a corresponding to the trench 76 and having the trench width B1 is fabricated, i.e. four trenches 70a to 76a have the same width B1 and the same depth. In FIG. 2A, elements identical to those in FIGS. 1A to 1B are designated by the same reference symbol, but followed by a lower-case letter a. Thus, the trenches 70a to 76a run through cut-out regions 62a to 68a of a hard mask layer 60a. The hard mask layer 60a was applied on a nitride layer 14a which, for its part, lies on a thin oxide layer 12a. All the trenches 70a to 76a lie in a silicon substrate 10a. A drain region 16a, corresponding to the drain region 16, lies directly below the oxide layer 12a. The trenches 62a to 68a extend right into a "buried" source region 18a.

The trenches 70a to 76a are subsequently filled with a filling material 200, which can easily be removed selectively with respect to silicon, e.g. a photoresist, polycrystalline germanium or polycrystalline silicon-germanium.

As illustrated in FIG. 2B, after a lithography method has been carried out, the filling material 200 is subsequently removed again from the trenches 70a and 76a with the aid of an etching step. An additional etching is then performed, during which the trenches 70a and 76a are deepened such that their bottom 202 and 204, respectively, lies significantly below the source region 18a.

The process steps explained with reference to FIG. 2B are followed by the process steps explained above with reference to FIGS. 1D to 1J.

p-type field-effect transistors can also be fabricated in the same way as explained with reference to FIGS. 2A and 2B.

In the process variant explained last, the length of the gate region is likewise essentially determined by the depth of the trench 72a. However, the insulation with respect to the adjacent component only has a width B1 of the deep trench 76a, for example only around 100 to 200 nm.

Figure 3:
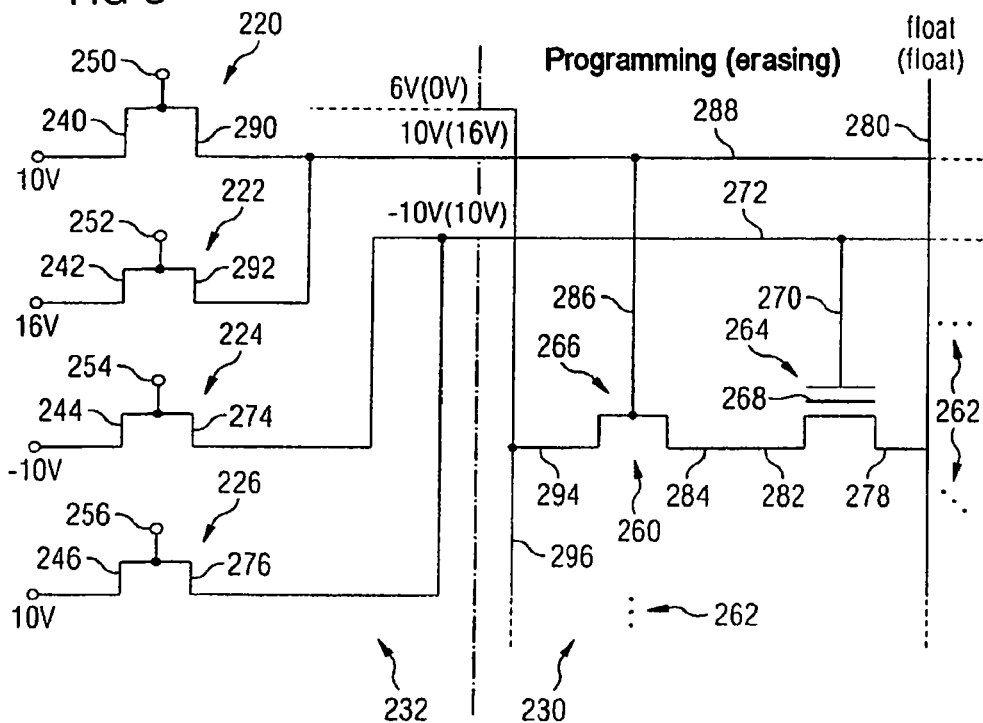
FIG. 3 shows the use of vertical field-effect transistors for driving a memory cell array in an EEPROM.

FIG. 3 shows the use of vertical field-effect transistors 220 to 226 of a memory cell array 230. The vertical field-effect transistors 220 to 226 are part of a drive unit 232, which is separated from the memory cell array 230 in FIG. 3 by a broken line 234. The drive unit 232 drives the memory cell array 230 for example according to the so-called NOR method or according to the NAND method.

The vertical transistors 220 to 226 were fabricated by a method as has been explained above with reference to FIGS. 1A to 1J or 2A to 2B. Terminals 240, 242, 244 and 246 of the transistors 220, 222, 224 and 226, respectively, in this order, are at potentials of 10 volts, 16 volts, −10 volts and +10 volts. Gate terminals 250 to 256 of the transistors 220 to 226 are driven by a control unit (not illustrated) in order to drive memory cells of the memory cell array 230 in accordance with a programming method or erasing method. However, the drive methods are not the subject matter of the present application and are not, therefore, explained in any further detail.

A basic circuit for a memory cell 260 of the memory cell array 230 is specified in FIG. 3. Further memory cells of a memory matrix are indicated by arrows 262. The other memory cells of the memory cell array 230 are constructed like the memory cell 260.

The memory cell 260 contains a memory transistor 264 and a drive transistor 266. The memory transistor 264 is a field-effect transistor with a charge-storing intermediate layer 268 between a gate terminal 270 and a channel region. The gate terminal 270 is connected to a word line 272, which leads to a terminal 274 of the transistor 224 and to a terminal 276 of the transistor 226. A terminal 278 of the transistor 264 leads to an auxiliary line 280, the potential of which does not influence the programming and erasing of the memory cell 260. A terminal 282 of the transistor 264 is connected to a terminal 284 of the transistor 266. A gate terminal 286 of the transistor 266 leads to a further word line 288, which is connected to a terminal 290 of the transistor 220 and to a terminal 292 of the transistor 222.

A terminal 294 of the transistor 266 is connected to a bit line 296, to which the drive unit 232 applies a voltage of 6 volts in the case of programming and a voltage of 0 volts in the case of erasing the memory cell 260.

The memory cells explained with reference to FIG. 3 are memory cells of an EEPROM. In so-called flash memory modules, there is only one memory transistor in a memory cell 260. A drive transistor 266 is not necessary. In another exemplary embodiment, the memory transistor 264 and the drive transistor 266 are realized in one transistor, i.e. in a so-called split-gate transistor.

What is common to all the cell structures mentioned, however, is that erasing voltages and programming voltages of comparatively high magnitude are necessary, which are generated with the aid of the vertical field-effect transistors 220 to 226. Through the use of the vertical transistors 220 to 226, the drive unit 232 can be miniaturized as the degree of integration increases in the same way as the memory cell array 230.

Figure 4:
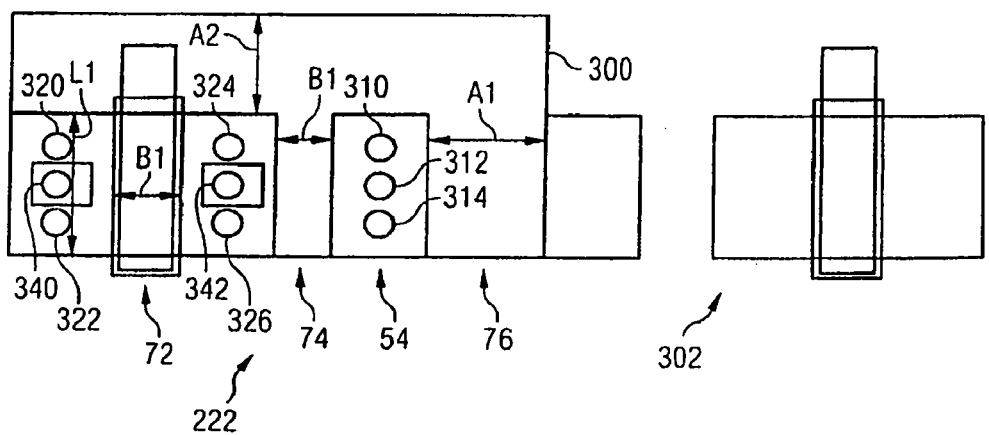
FIG. 4 shows a plan view of a vertical field-effect transistor.

FIG. 4 shows a plan view of the vertical field-effect transistor 222, which has been fabricated in accordance with the first process variant. A rectangle 300 circumscribes the chip area required for the transistor 222 including an insulation clearance with respect to adjacent components. An insulation clearance A1 in the longitudinal direction of the rectangle 300 has the width B1 of the trench 76. An insulation clearance A2 in the transverse direction of the rectangle 300 likewise has the width B1. A trench length L1 is additionally depicted in FIG. 4. Since the walls on both sides of the trench 72 contribute to the transistor width, the electrically effective width W is twice as large as the trench length L1.

FIG. 4 additionally illustrates source contacts 310 to 314, which lead via the connecting region 54 to the buried source region 18. Lying to the left of the trench 72 for the control region are two drain contacts 320 and 322, which lead to the drain region 16 between the trenches 70 and 72. Two drain contacts 324 and 326 lying to the right of the trench 72 lead to the drain region between the trench 72 and the trench 74.

In order to prevent the silicon substrate 10 from being charged in the region of the field-effect transistor 222, there is a substrate contact 340 between the drain contacts 320 and 322 and a substrate contact 342 between the drain contacts 324 and 326. The substrate contacts 340 and 342 are insulated from the drain region 16. Separate n-type, p-type and so-called triple wells, as are customary nowadays, can be obviated through the use of the substrate contacts 340 and 342.

In other exemplary embodiments, the drain region lies at the end of the trenches 70 to 76 and the source region lies in the vicinity of the substrate surface.

FIG. 5 shows a cross section through a vertical field-effect transistor 350 with doubly cascaded gate regions. During the fabrication of the field-effect transistor 350, four trenches 70b, 72b, 74b and 76b are produced, corresponding to the trenches 70 to 76 and to the trenches 70a to 76a. However, an additional trench 352 was also produced between the trench 72b and the trench 74b, said additional trench having the same dimensions and the same fillings as the trench 72b.

Moreover, the distance between the trenches 72b and 74b in the transistor 350 is about twice as large as the distance between the trenches 72 and 74 and between the trenches 72a and 74a, in order to create space for the trench 352.

As can readily be discerned in FIG. 5, the channel forms along vertical sidewalls 360 to 366 of the trench 72b and of the trench 352. Arrows 370 to 376 indicate the quadruple current flow from drain regions 16c to a source region 18c. The control regions in the trenches 72b and 352 are electrically connected in parallel, see connections 380. The drain regions 16c are also electrically connected in parallel, see connections 382. The channel length 1 of a channel is represented by an arrow in FIG. 5.

In other exemplary embodiments, more than two control regions for more than four channel regions are cascaded in a transistor.

In the drive units for driving a memory cell array transistors having a minimal width Ware also used to a large extent. Typical values for a minimal dimension of a transistor designed for 5 volts are W=0.35 μm, L=0.7 μm and A=0.9 μm. If such narrow transistors are required, the highly doped terminal region 54, 54a or 54b can directly adjoin the trench 72b for the control region. In this case, the channel forms only at one trench wall, e.g. at the wall 360 of the trench 72b.

FIG. 6 shows a plan view of three vertical field-effect transistors 400, 402 and 404 connected in parallel, which, instead of the trenches, have cylindrical depressions for the control regions. It goes without saying that it is also possible, for example, to fabricate only one field-effect transistor 400 solely as a single transistor. The use of cylindrical depressions is appropriate in particular for very wide transistors, because the reduction of the layout width is particularly high with cylindrical depressions. U=2 Pi r holds true, where U is the periphery or the width, Pi is the number of the same name and r is the radius of the cylindrical depression.

In the field-effect transistors explained above with reference to FIGS. 1A to 1J and FIGS. 2A and 2B, the channel region is completely insulated from the substrate, namely laterally by the trenches and into the depth by the buried source or drain region. On account of this arrangement, such a transistor is similar in a way to an SOI transistor (Silicon On Insulator). The so-called punch strength of SOI transistors is significantly better than that of bulk transistors. This advantage also applies to the vertical field-effect transistors. The depth of the vertical transistors can be reduced as a result.

Moreover, the so-called driver capability of the vertical field-effect transistor is increased by the adoption of properties of an SOI transistor. The transistor width can thus be reduced with the electrical properties otherwise remaining the same.

The invention claimed is:

1. A method comprising:
fabricating a field-effect transistor having the following steps to be performed without restriction by the order specified:
provision of a carrier material having a surface to be processed,
formation of a first terminal region near the surface and a second terminal region remote from the surface, wherein formation of the second terminal region comprises formation of a connecting region extending up from a portion of the of the second terminal region approximately as far as the surface or being electrically conductively connected to an electrically conductive connection leading from the second terminal to the surface;
formation of a first depression;
formation of a second depression between the first terminal region and the connecting region;
production of an electrical insulating layer in the first depression,
introduction of an electrically conductive control region into the first depression, wherein the first depression is the only depression formed in the field-effect transistor in which the control region is formed; and
using the field-effect transistor at a word line or a bit line of a memory cell array.

2. The method of claim 1, wherein the formation of the terminal regions is performed at least one of: before the formation of the depression and before filling of the depression.

3. The method of claim 1, wherein at least one insulating depression is formed at the same time as the depression for the control region.

4. The method of claim 3, wherein the insulating depression is formed with the same depth as the depression for the control region.

5. The method of claim 3, wherein the insulating depression is made deeper than the depression for the control region.

6. A method comprising:
fabricating a field-effect transistor having the following steps to be performed without restriction by the order specified:
provision of a carrier material having a surface to be processed,
formation of a first terminal region near the surface and a second terminal region remote from the surface, wherein formation of the second terminal region comprises formation of a connecting region extending up from a portion of the of the second terminal region approximately as far as the surface or being electrically conductively connected to an electrically conductive connection leading from the second terminal to the surface;
formation of a first depression;

formation of a second depression between the first terminal region and the connecting region;

production of an electrical insulating layer in the first depression, introduction of an electrically conductive control region into the first depression, wherein the first depression is the only depression formed in the field-effect transistor in which the control region is formed.

7. The method of claim 6, wherein the formation of the terminal regions is performed at least one of: before the formation of the depression and before filling of the depression.

8. The method of claim 6, wherein at least one insulating depression is formed at the same time as the depression for the control region.

9. The method of claim 8, wherein the insulating depression is formed with the same depth as the depression for the control region.

10. The method of claim 8, wherein the insulating depression is made deeper than the depression for the control region.

11. A method comprising:

fabricating a field-effect transistor having the following steps to be performed without restriction by the order specified:

provision of a carrier material having a surface to be processed, formation of a first terminal region near the surface and a second terminal region remote from the surface, wherein formation of the second terminal region comprises formation of a connecting region extending up from a portion of the of the second terminal region approximately as far as the surface or being electrically conductively connected to an electrically conductive connection leading from the second terminal to the surface;

formation of a first depression;

formation of a second depression between the first terminal region and the connecting region;

introduction of an electrically conductive control region into the first depression, wherein the first depression is the only depression formed in the field-effect transistor in which the control region is formed.

12. The method of claim 11, wherein the formation of the terminal regions is performed at least one of: before the formation of the depression and before filling of the depression.

13. The method of claim 11, wherein at least one insulating depression is formed at the same time as the depression for the control region.

14. The method of claim 13, wherein the insulating depression is formed with the same depth as the depression for the control region.

15. The method of claim 13, wherein the insulating depression is made deeper than the depression for the control region.

16. The method of claim 11, wherein fabricating the field-effect transistor has the following additional steps to be performed without restriction by the order specified:

formation of a third depression such that the connecting region is between the second and third depressions.

17. The method of claim 16, wherein the third depression is formed to extend below a bottom edge of the second terminal region.

* * * * *